(12) United States Patent
Takabe (10) Patent No.: US 9,809,026 B2
(45) Date of Patent: Nov. 7, 2017

(54) PIEZOELECTRIC DEVICE, LIQUID EJECTION HEAD, AND METHOD OF MANUFACTURING PIEZOELECTRIC DEVICE

(71) Applicant: SEIKO EPSON CORPORATION, Tokyo (JP)

(72) Inventor: Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/178,809

(22) Filed: Jun. 10, 2016

(65) Prior Publication Data

US 2017/0001443 A1   Jan. 5, 2017

(30) Foreign Application Priority Data

Jul. 2, 2015 (JP) ................... 2015-133268

(51) Int. Cl.
   *B41J 2/14* (2006.01)
   *B41J 2/16* (2006.01)
   *H01L 41/08* (2006.01)
   *H01L 41/09* (2006.01)

(52) U.S. Cl.
   CPC ........... *B41J 2/161* (2013.01); *B41J 2/14233* (2013.01); *B41J 2/1623* (2013.01); *B41J 2/1632* (2013.01); *H01L 41/0805* (2013.01); *H01L 41/0973* (2013.01); *B41J 2002/14241* (2013.01); *B41J 2002/14266* (2013.01)

(58) Field of Classification Search
   CPC .............. H01L 41/0805; H01L 41/0973; B41J 2/14233; B41J 2002/14241; B41J 2002/14266
   See application file for complete search history.

(56) References Cited

U.S. PATENT DOCUMENTS

| 7,695,118 B2* | 4/2010 | Lee ....................... B41J 2/14233 347/71 |
| 2004/0130601 A1* | 7/2004 | Shimada .............. B41J 2/14233 347/68 |
| 2009/0213187 A1 | 8/2009 | Kitakami et al. |

FOREIGN PATENT DOCUMENTS

JP   2015-089614 A   5/2015

* cited by examiner

*Primary Examiner* — Geoffrey Mruk
(74) *Attorney, Agent, or Firm* — Workman Nydegger (57) ABSTRACT

A piezoelectric device includes a first substrate having an empty chamber, a diaphragm defining a surface of the empty chamber, a piezoelectric element formed by stacking a first electrode layer, a piezoelectric layer, and a second electrode layer in sequence from the diaphragm side, the piezoelectric element provided on the side of the diaphragm opposite to the empty chamber, and a second substrate provided on the side of the first substrate opposite to the diaphragm. The thickness of at least a part of the first substrate in an opening peripheral area of the empty chamber is thicker than the thickness in an area outside the opening peripheral area.

6 Claims, 11 Drawing Sheets

PIEZOELECTRIC DEVICE, LIQUID EJECTION HEAD, AND METHOD OF MANUFACTURING PIEZOELECTRIC DEVICE

BACKGROUND

1. Technical Field

The present invention relates to a piezoelectric device, a liquid ejection head, and a method of manufacturing the piezoelectric device, the piezoelectric device including a first substrate having an empty chamber and a piezoelectric element formed on a diaphragm that defines the empty chamber.

2. Related Art

Piezoelectric devices including piezoelectric elements have various applications, for example, liquid ejecting apparatuses and vibration sensors. For example, a liquid ejecting apparatus ejects (discharges) various kinds of liquids from a liquid ejection head by using the piezoelectric device. Examples of liquid ejecting apparatuses include image recording apparatuses such as ink jet printers and ink jet plotters. In recent years, liquid ejecting apparatuses that have the capability of accurately discharging a very small amount of liquid at predetermined positions have been provided in various manufacturing apparatuses. These applications include, for example, display manufacturing apparatuses for manufacturing color filters for liquid crystal displays, electrode forming apparatuses for forming electrodes for organic electroluminescence (EL) displays and field emission displays (FEDs), and chip manufacturing apparatuses for manufacturing biochips (biochemical chips). A recording head for image recording apparatuses ejects liquid ink, and a color material ejection head for display manufacturing apparatuses ejects solutions of individual coloring materials of red (R), green (G), and blue (B). An electrode material ejection head for the electrode forming apparatus ejects a liquid electrode material, and a bio-organic compound ejection head for chip manufacturing apparatuses ejects a solution of bio-organic compounds.

The liquid ejection head having the piezoelectric device includes a plurality of nozzles, and pressure chambers and piezoelectric elements corresponding to each individual nozzle. The pressure chamber is formed by etching a substrate (actuator substrate), and a part of the pressure chamber is defined by a flexible diaphragm. On the diaphragm, a piezoelectric element that includes a lower electrode layer, a piezoelectric layer of a piezoelectric material such as titanate zirconate (PZT), and an upper electrode layer is formed. A communication substrate is bonded to the opposite side of the pressure chamber-formed substrate, and the pressure chamber communicates with the nozzle via a nozzle communication path formed in the communication substrate. The liquid ejection head of the structure applies a voltage to deform the pressure chambers corresponding to the respective nozzles to cause a pressure variation to be generated in the liquid in the corresponding pressure chambers so as to eject the liquid from the nozzles (see, for example, JP-A-2015-89614).

Figure 12:
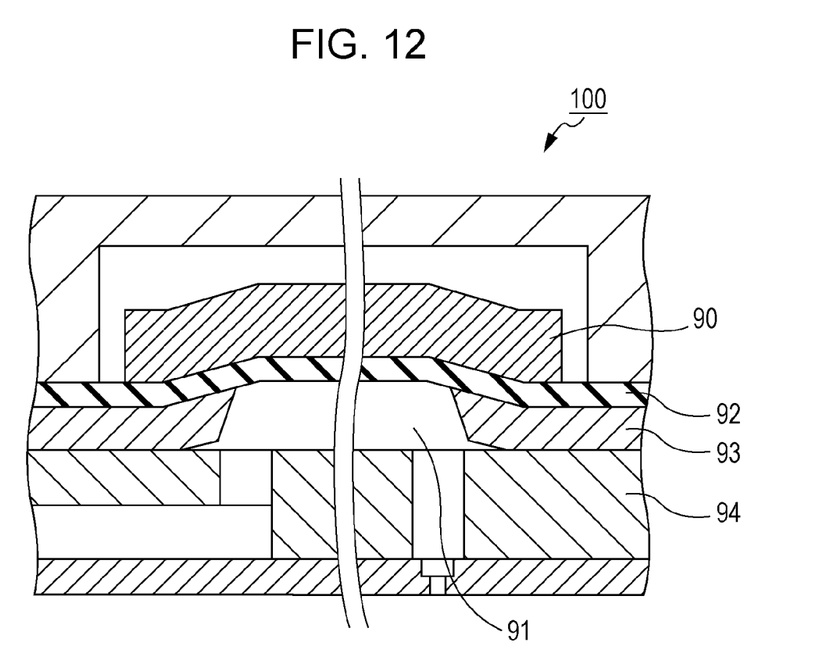
FIG. 12 is a cross-sectional view of an enlarged main part of a structure of a traditional recording head.

The tendency to downsize the liquid ejection heads has led to the thickness of pressure chamber-formed substrates being decreased. These thinner substrates decrease the stiffness of the pressure chamber-formed substrate, and the substrates can be readily deformed. In particular, a partition wall that defines adjacent pressure chambers in the pressure chamber-formed substrate has been downsized in the pressure chamber array direction due to the recent increased packaging density that has led to the narrowed pitch of the pressure chambers. Consequently, the stiffness of the partition wall defining the pressure chambers has been decreasing. This decreased stiffness enables the pressure chamber-formed substrate to be readily deformed and may cause separation of the pressure chamber-formed substrate and the communication substrate that is bonded to the substrate. For example, as shown in a recording head 100 illustrated in FIG. 12, a multilayered piezoelectric element 90 may be deformed in a direction opposite to a pressure chamber 91 in an initial state (in a state in which no voltage is being applied), for example, due to a tensile force caused by the layers (films) constituting the piezoelectric element 90. If the deformation is transmitted to a part of a pressure chamber-formed substrate 93 that defines the periphery of the pressure chamber 91 via a diaphragm 92, especially, the pressure chamber-formed substrate 93 (that is, the partition wall portion that defines the pressure chamber 91) on the periphery of the pressure chamber 91 deforms to curve toward the piezoelectric element 90. Due to this deformation, for example, the adhesive that bonds the pressure chamber-formed substrate 93 and the communication substrate 94 comes off, and a part of the pressure chamber-formed substrate 93 may be separated from the communication substrate 94. Such a problem may similarly occur in other piezoelectric devices that include a first substrate formed by providing a piezoelectric element above an empty chamber and a second substrate that is bonded to the first substrate.

SUMMARY

An advantage of some aspects of the invention is that a piezoelectric device, a liquid ejection head, and a method of manufacturing the piezoelectric device, the piezoelectric device capable of reducing the separation of a first substrate having an empty chamber and a second substrate provided on the first substrate, are provided.

According to a first aspect of the invention, a piezoelectric device includes a first substrate having an empty chamber, a diaphragm defining a surface of the empty chamber, a piezoelectric element formed by stacking a first electrode layer, a piezoelectric layer, and a second electrode layer in sequence from the diaphragm side, the piezoelectric element provided on the side of the diaphragm opposite to the empty chamber, and a second substrate provided on the side of the first substrate opposite to the diaphragm. The thickness of at least a part of the first substrate in an opening peripheral area of the empty chamber is thicker than the thickness in an area outside the opening peripheral area.

With this structure, even if the piezoelectric element is deformed toward the side opposite to the diaphragm, the separation of the first substrate and the second substrate can be suppressed. Consequently, the reliability of the piezoelectric device can be increased.

In the above-described structure, it is preferable that the thickness in the entire periphery of the opening peripheral area be thicker than the thickness in the area outside the opening peripheral area.

With this structure, the separation of the first substrate and the second substrate can be further suppressed. Consequently, the reliability of the piezoelectric device can be increased.

According to a second aspect of the invention, a piezoelectric device includes a first substrate having an empty chamber, a diaphragm defining a surface of the empty chamber, a piezoelectric element formed by stacking a first electrode layer, a piezoelectric layer, and a second electrode layer in sequence from the diaphragm side, the piezoelectric element provided on the side of the diaphragm opposite to the empty chamber, and a second substrate provided on the side of the first substrate opposite to the diaphragm. The thickness of at least a part of the first substrate is gradually increased toward the empty chamber.

With this structure, the separation of the first substrate and the second substrate can be suppressed. Consequently, the reliability of the piezoelectric device can be increased.

According to a third aspect of the invention, a liquid ejection head includes the piezoelectric device of one of the above-described structures and a nozzle communicating with the empty chamber.

According to a fourth aspect of the invention, a method of manufacturing a piezoelectric device including a first substrate having an empty chamber, a diaphragm defining a surface of the empty chamber, a piezoelectric element formed by stacking a first electrode layer, a piezoelectric layer, and a second electrode layer in sequence from the diaphragm side, the piezoelectric element provided on the side of the diaphragm opposite to the empty chamber, and a second substrate provided on the side of the first substrate opposite to the diaphragm is provided. The method includes forming the piezoelectric element on a side to be the diaphragm of a substrate including the first substrate and the diaphragm, polishing the substrate on the side opposite to the piezoelectric element while an area other than the piezoelectric element on the substrate is being pressed from the side of the piezoelectric element in the thickness direction such that the thickness of the substrate in an area not pressed becomes thicker than the thickness of the substrate in the pressed area, forming the empty chamber in the area where the polished substrate is thicker, the area corresponding to the piezoelectric element such that the substrate includes the first substrate and the diaphragm, and bonding the second substrate to the side of the first substrate opposite to the piezoelectric element.

It is preferable that, in the substrate, the area not pressed in the polishing protrude toward the side opposite to the piezoelectric element compared with the pressed area.

By employing these methods, the separation of the first substrate and the second substrate can be suppressed, and a high-reliability piezoelectric device can be manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the embodiments of the present invention will be described with reference to the attached drawings. In the embodiments described below, various limitations have been made as preferred embodiments of the invention, however, it is to be understood that the scope of the invention is not limited to the embodiments unless otherwise described to limit the invention in the following description. In the description below, an example ink jet printer (hereinafter, referred to as a printer) that is a kind of liquid ejecting apparatuses including an ink jet recording head (hereinafter, referred to as a recording head) that is a kind of liquid ejection head including a piezoelectric device according to an embodiment of the invention will be described.

Figure 1:
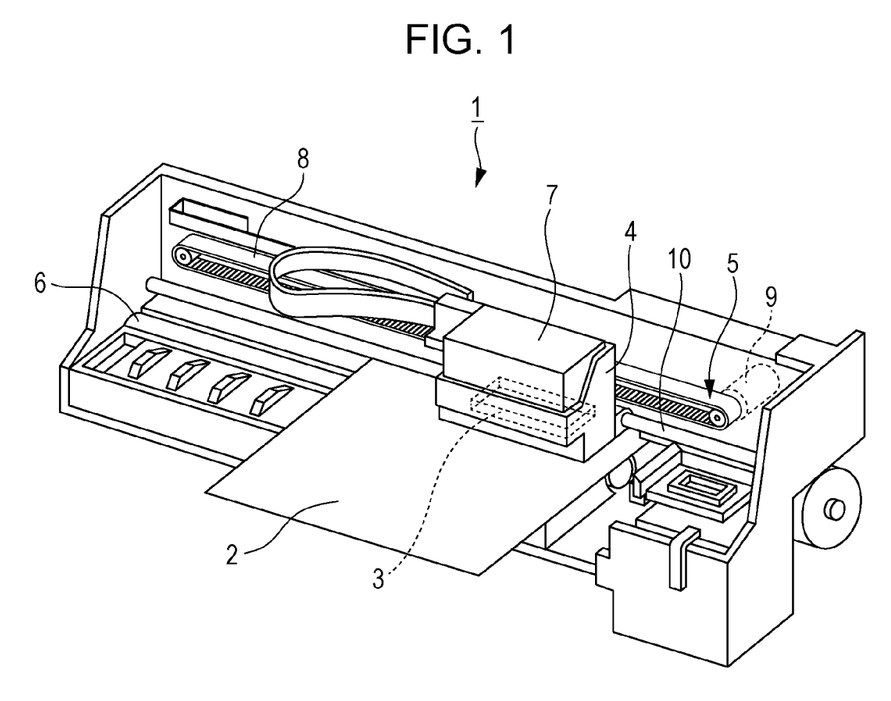
FIG. 1 is a perspective view of a structure of a printer.

With reference to FIG. 1, a structure of a printer 1 is described. The printer 1 is a device that records, for example, an image onto a surface of a recording medium 2 (a kind of target on which ink droplets are to be ejected) such as recording paper by ejecting ink (a kind of liquid) onto the recording medium 2. The printer 1 includes a recording head 3, a carriage 4 to which the recording head 3 is attached, a carriage moving mechanism 5 that moves the carriage 4 in a main scanning direction, and a transportation mechanism 6 that transports the recording medium 2 in a sub-scanning direction. An ink cartridge 7 stores the ink, and serves as a liquid supply source. The ink cartridge 7 can be detachably attached to the carriage 4, that is, the recording head 3. The ink cartridge may be provided to the body side of the printer, and the ink may be supplied from the ink cartridge to the recording head via an ink supply tube.

The carriage moving mechanism 5 includes a timing belt 8. A pulse motor 9, for example, a direct current motor (DC motor), drives the timing belt 8. Consequently, when the pulse motor 9 operates, the carriage 4 reciprocates in the main scanning direction (the width direction of the recording medium 2) while being guided by a guide rod 10 that is provided in the printer 1. A linear encoder (not shown) which is a kind of positional information detection device detects a position of the carriage 4 in the main scanning direction. The linear encoder sends the detected signal, that is, an encoder pulse (a kind of positional information), to a controller of the printer 1.

Figure 2:
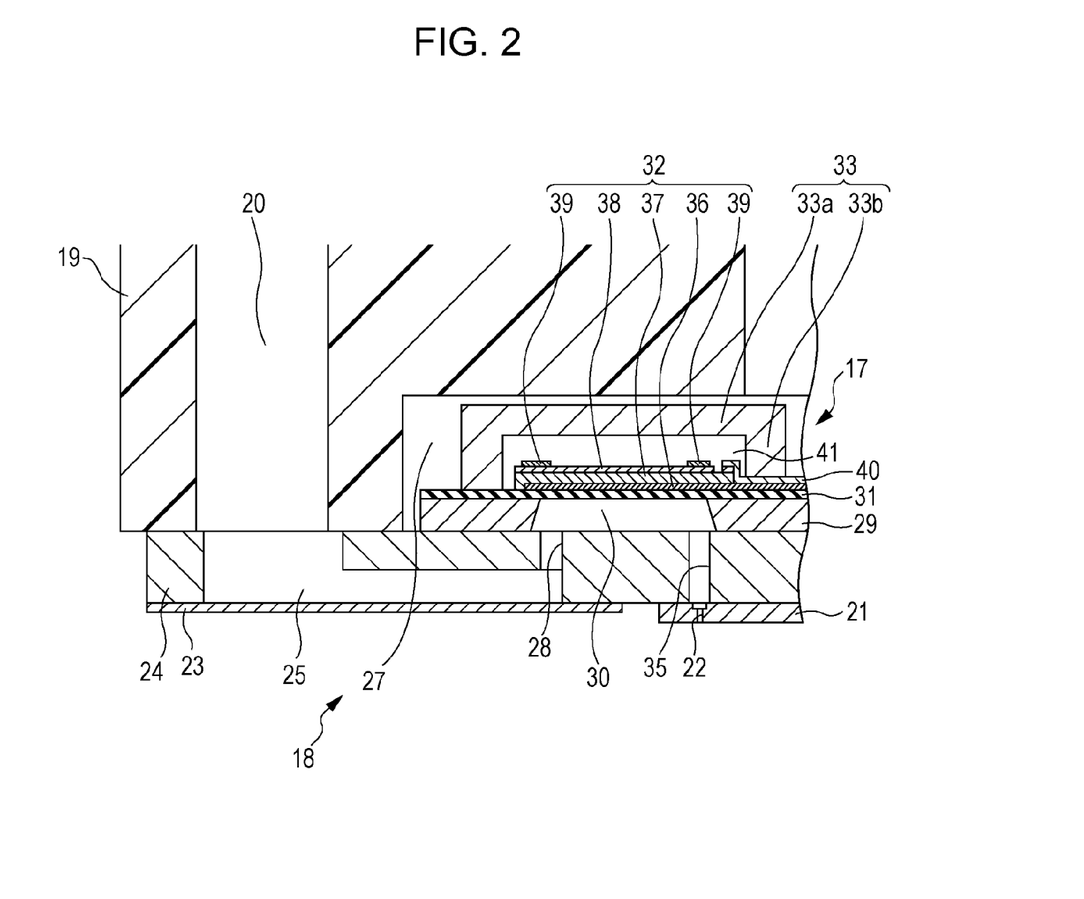
FIG. 2 is a cross-sectional view of an enlarged main part of a structure of a recording head.
Figure 3:
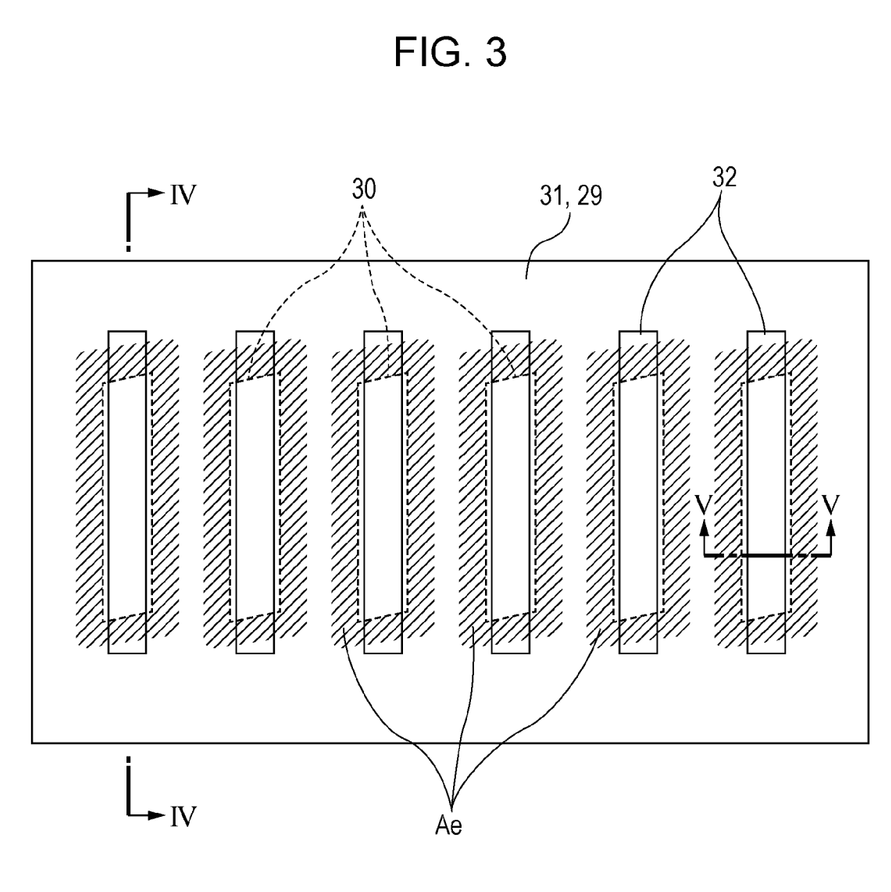
FIG. 3 is a plan view of a pressure chamber-formed substrate viewed from the side of a diaphragm.
Figure 4:
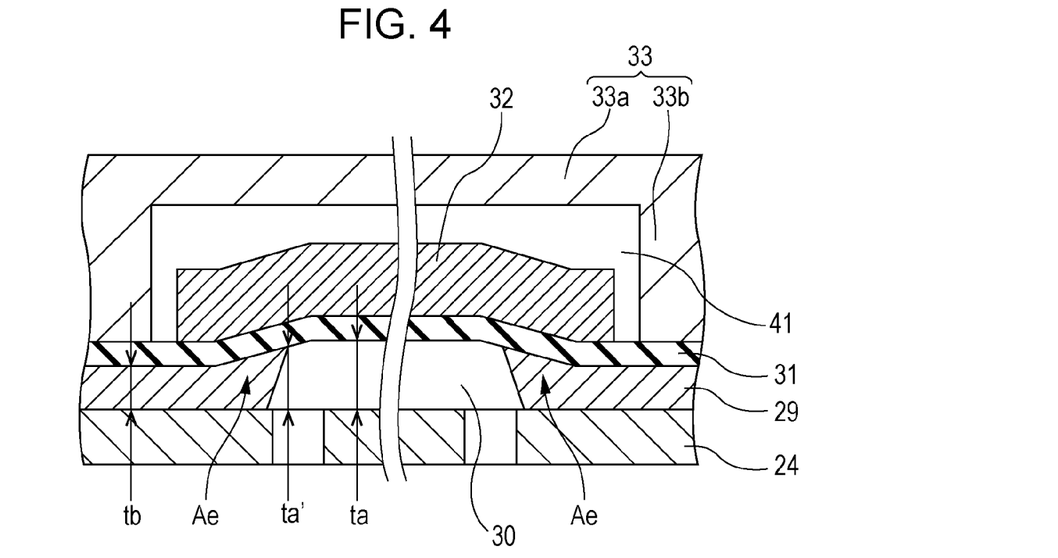
FIG. 4 is a cross-sectional view taken along the line IV-IV in FIG. 3.
Figure 5:
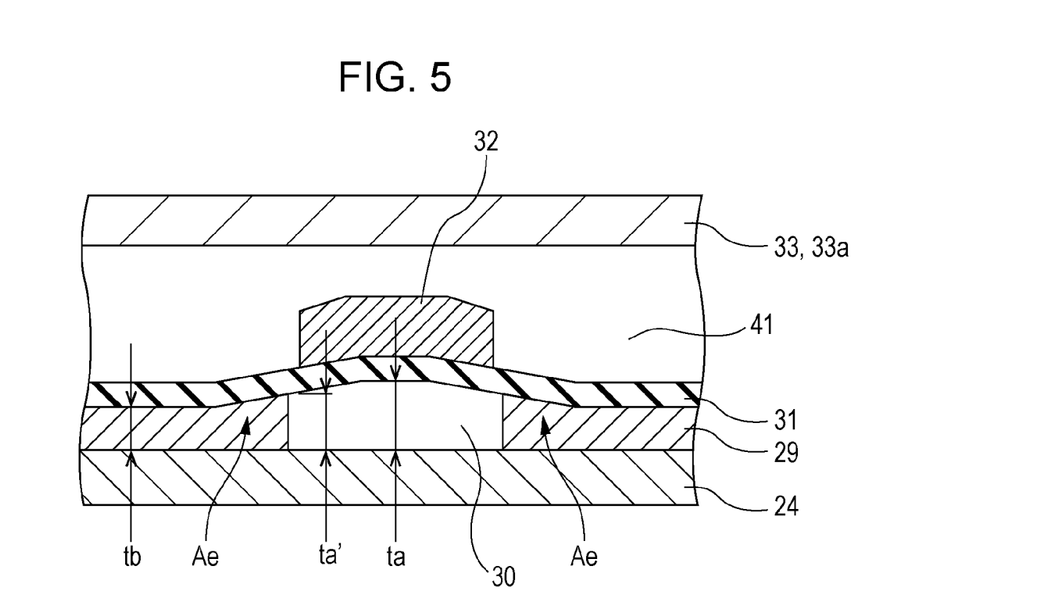
FIG. 5 is a cross-sectional view taken along the line V-V in FIG. 3.

FIG. 2 is a cross-sectional view of a structure of a main part of the recording head 3. FIG. 3 is a schematic plan view of a pressure chamber-formed substrate 29 in the recording head 3 viewed from a diaphragm 31 side (sealing plate 33 side). In FIG. 3, the sealing plate 33 is shown as a transparent plane. FIG. 4 is an enlarged view of the IV-IV cross section in FIG. 3. FIG. 5 is an enlarged view of the V-V cross section in FIG. 3. The recording head 3 according to the embodiment includes a pressure generation unit 17 and a flow path unit 18 as shown in FIG. 2, and these components are stacked and attached to a head case 19. The flow path unit 18 includes a nozzle plate 21, a compliance substrate 23, and a communication substrate 24 (second substrate according to the invention). The pressure generation unit 17 includes the pressure chamber-formed substrate 29 (first substrate according to the invention) that has a pressure chamber 30, the diaphragm 31, a piezoelectric element 32, and the sealing plate 33, that are stacked as a unit. These units are bonded with an adhesive.

A head case 19 is, for example, a box-shaped member composed of synthetic resin, and the communication substrate 24 to which the pressure generation unit 17 is bonded is fixed to the bottom. A storage space 27 that is a hollow portion of a rectangular parallelepiped extending from the lower surface in the height direction of the head case 19 is formed in the lower surface side of the head case 19. The storage space 27 accommodates the pressure generation unit 17 that is provided on the communication substrate 24 with the flow path unit 18 bonded in a state in which the flow path unit 18 is positioned on the lower surface of the head case 19. The head case 19 has a liquid introduction path 20. The liquid introduction path 20 is a space into which ink is introduced from the side of the ink cartridge 7. The ink flowing into the liquid introduction path 20 is introduced into a common liquid chamber 25, which will be described below, in the communication substrate 24.

The communication substrate 24 that is bonded to the lower surface of the head case 19 is a plate material made of, for example, a silicon single crystal substrate (hereinafter, also simply referred to as a silicon substrate). The communication substrate 24 has spaces serving as nozzle communication paths 35 and the common liquid chamber 25 formed by, for example, anisotropic etching. The nozzle communication paths 35 communicate with nozzles 22, which will be described below, and the pressure chambers 30. The nozzle communication paths 35 are formed for the corresponding nozzles 22. The nozzle communication path 35 communicates with an end portion of the corresponding pressure chamber 30 in the lengthwise direction. The common liquid chamber 25 extends in the nozzle array direction (in other words, the array direction of the pressure chambers 30) and is a space into which the ink common with the individual pressure chambers 30 is introduced. The common liquid chamber 25 communicates with the liquid introduction path 20, and the ink from the liquid introduction path 20 is introduced. The common liquid chamber 25 communicates with each pressure chamber 30 via a supply port 28 provided for each pressure chamber 30. The supply port 28 communicates with the other end portion of the corresponding pressure chamber 30 in the lengthwise direction. With this structure, the ink in the common liquid chamber 25 is distributed and supplied to the pressure chambers 30 via the supply ports 28.

The nozzle plate 21 and the compliance substrate 23 are bonded to the lower surface (the surface opposite to the head case 19) of the communication substrate 24. The nozzle plate 21 is a plate material that has a plurality of nozzles 22 opened therein, and the nozzle plate 21 is made of, for example, a silicon substrate. A nozzle array includes the nozzles 22 arranged in line in the sub-scanning direction. The nozzle array is arranged from the nozzle 22 at one end to the nozzle 22 at the other end with pitches according to a dot formation density. In this embodiment, specifically, the nozzle array is provided with narrow pitches (for example, 42.4 µm pitches, (that is, 600 dpi)) such that a high-quality image can be formed. The nozzle plate 21 is bonded to the central part of the lower surface of the communication substrate 24 in a state in which each nozzle 22 communicates with the nozzle communication path 35 in the communication substrate 24. The compliance substrate 23 is a flexible member that is bonded to the lower surface of the communication substrate 24 such that the compliance substrate 23 blocks the opening of the common liquid chamber 25. The compliance substrate 23 mitigates ink pressure variations in the common liquid chamber 25.

The pressure chamber-formed substrate 29 is made of, for example, a silicon substrate, and the pressure chamber-formed substrate 29 is connected (stacked) on the upper surface (the surface opposite to the nozzle plate 21) of the communication substrate 24. In this embodiment, specifically, the silicon substrate is polished to have a thickness of about 40 to 50 µm to be the pressure chamber-formed substrate 29, as will be described below. The pressure chamber-formed substrate 29 includes a plurality of pressure chambers 30 (empty chambers in this invention) that are formed through the pressure chamber-formed substrate 29 in its thickness direction with the same pitch as that of the nozzles 22. In this embodiment, the pressure chamber 30 is substantially a parallelogram elongated in the direction orthogonal to the nozzle array direction as shown in the plan view (in a state viewed from the front side of the pressure chamber-formed substrate 29, or in a state viewed from the stacking direction of the components) in FIG. 3. As shown in FIGS. 2 and 4, in the lengthwise direction of the pressure chamber 30, the inner wall that defines the pressure chamber 30 is inclined to be outwardly widened from the upper surface toward the lower surface with respect to the surface of the pressure chamber-formed substrate 29. The partition walls that define the individual pressure chambers 30 in the pressure chamber-formed substrate 29 are thicker than the walls at other portions. This structure will be described in detail below.

The diaphragm 31 is a flexible film that defines a surface (upper surface) of the pressure chamber 30, and the diaphragm 31 is provided on the upper surface of the pressure chamber-formed substrate 29. The diaphragm 31 includes, for example, an elastic film composed of silicon dioxide ($SiO_2$), and an insulating film composed of zirconium oxide (ZrOx) formed on the elastic film. A portion that defines the pressure chamber 30 in the diaphragm 31, that is, a portion that blocks the upper opening of the space to be the pressure chamber 30 is allowed to be deformed in a direction away from or toward the nozzle 22 by deformation of the piezoelectric element 32. In this embodiment, the diaphragm 31 and the pressure chamber-formed substrate 29 are formed separately with different members, however, the structure is not limited to this example, and the diaphragm and the pressure chamber-formed substrate may be integrated into one unit. For example, the pressure chamber may be formed by etching a substrate corresponding to the pressure chamber-formed substrate from the lower surface side partway in the thickness direction of the substrate with a thin portion remaining on the upper surface. In this case, the remaining thin portion is to become the diaphragm.

The piezoelectric element 32 is formed on the diaphragm 31 on the side opposite to the pressure chamber 30 in the portion corresponding to the pressure chamber 30. The piezoelectric element 32 according to the embodiment is a so-called flexure mode piezoelectric element. A film forming technique is used to provide a piezoelectric element 32 that has a metal lower electrode layer 36 (first electrode according to the invention), a piezoelectric layer 37 composed of, for example, titanate zirconate (PZT), and a metal upper electrode layer 38 (second electrode according to the invention), in sequence from the side of the diaphragm 31, as shown in FIG. 2. In the piezoelectric element 32, the piezoelectric layer 37 is to be deformed by application of a voltage to the lower electrode layer 36 and the upper electrode layer 38. The piezoelectric element 32 according to the embodiment is extended to the outside of the pressure chamber 30 such that both end portions of the piezoelectric element 32 in the lengthwise direction exceed the ends of the pressure chamber 30 in the lengthwise direction, as shown in FIG. 3. On the other hand, both end portions in the widthwise direction are shorter than the ends of the pressure chamber 30 in the widthwise direction.

In this embodiment, the lower electrode layer 36 and the piezoelectric layer 37 are patterned for each pressure chamber 30, and the upper electrode layer 38 is patterned over the plurality of pressure chambers 30. That is, the lower electrode layers 36 are individual electrodes for the individual pressure chambers 30, and the upper electrode layer 38 is a common electrode for the piezoelectric elements 32. In this embodiment, a metal layer 39 composed of, for example, gold (Au) is provided over the upper electrode layer 38 via an adhesion layer (not shown) composed of titanium (Ti) or nickel (Ni) as shown in FIG. 2. The metal layer 39 is provided over the boundaries of the inside and the outside of the pressure chamber 30 in the lengthwise direction corresponding to both ends of the piezoelectric element 32 in the lengthwise direction. The metal layer 39 suppresses the deformation (displacement) of the piezoelectric element 32 at the boundaries of the inside and outside of the pressure chamber 30 and suppresses breakage of the piezoelectric element 32 due to a stress concentration. A lead electrode 40 is connected to an end portion of one side (side of the central portion of the recording head 3) of the piezoelectric element 32. The lead electrode 40 is extended to the outside of the sealing plate 33 and connected to a flexible cable (not shown). Alternatively, the lower electrode layer 36 may be a common electrode for the piezoelectric elements 32, and the upper electrode layers 38 may be individual electrodes for the piezoelectric elements 32.

The sealing plate 33 is disposed above the upper surface of the pressure chamber-formed substrate 29 over which the piezoelectric elements 32 have been formed. The sealing plate 33 is made of, for example, glass, a ceramic material, a silicon single crystal substrate, metal, or a synthetic resin. In the sealing plate 33, a piezoelectric element housing space 41 of a size not interfering with the drive of the piezoelectric elements 32 is provided in the area facing the individual piezoelectric elements 32. The piezoelectric element housing space 41 of the sealing plate 33 is defined by a ceiling portion 33a that faces the piezoelectric elements 32, and side wall portions 33b that are extended from the outer circumferential surface of the ceiling portion 33a towards the piezoelectric elements 32. The side wall portion 33b is extended to the outside of the array of the piezoelectric elements 32 in the array direction (nozzle array direction) of the piezoelectric elements 32 such that all of the piezoelectric elements 32 arranged within the piezoelectric element housing space 41 can be accommodated. The lower end surface of the side wall portion 33b is bonded to the upper surface of the pressure chamber-formed substrate 29 in a state in which the array of the piezoelectric elements 32 is being accommodated within the piezoelectric element housing space 41.

In the recording head 3 that has the above-described structure, the ink from the ink cartridge 7 is introduced into the pressure chambers 30 via the liquid introduction path 20, the common liquid chamber 25, and the supply ports 28. In this state, drive signals from the controller are supplied to the piezoelectric elements 32 via the flexible cable and the lead electrode 40 to drive the piezoelectric elements 32. This drive operation changes the capacity of the pressure chamber 30 and this causes pressure variations in the pressure chamber 30. The use of the pressure variations enables the nozzles 22 to eject ink droplets from the nozzles 22 via the nozzle communication paths 35. In this embodiment, the combination of the communication substrate 24, the pressure chamber-formed substrate 29, the diaphragm 31, and the piezoelectric element 32 in the layers that constitute the recording head 3 corresponds to the piezoelectric device according to the embodiment of the invention.

The pressure chamber-formed substrate 29 according to the embodiment is described in detail. As shown in FIGS. 4 and 5, the thickness in an opening peripheral area Ae (hatched area in FIG. 3, the entire opening periphery of each pressure chamber 30) of each pressure chamber 30 in the pressure chamber-formed substrate 29 is thicker than the thickness of the substrate outside the opening peripheral area Ae. In this embodiment, the thickness of the substrate is gradually increased toward the pressure chamber 30. More specifically, as illustrated in FIGS. 4 and 5, the piezoelectric element 32 is deformed to the side opposite to the pressure chamber 30 in the initial state (in a state in which no voltage is applied to the upper electrode layer 38 and the lower electrode layer 36) due to a tensile force caused by the layers (for example, the metal layer 39) of the piezoelectric element 32. Consequently, the ceiling surface (the diaphragm 31 that blocks the upper opening of the pressure chamber 30) in the substantially central portion of the pressure chamber 30 is raised upward (toward the side of the sealing plate 33). In other words, the distance (that is, the height in the substantially central portion of the pressure chamber 30) ta between the lower surface of the diaphragm 31 and the upper surface of the communication substrate 24 in the substantially central portion of the pressure chamber 30 is longer (thicker) than the substrate thickness tb of the area outside the opening peripheral area Ae of the pressure chamber-formed substrate 29 (for example, the substrate thickness tb is the thickness in a portion corresponding to a portion in which the side wall portion 33b is located).

The upper surface of the pressure chamber-formed substrate 29 at an opening edge of the pressure chamber 30 protrudes upward. In other words, the thickness (that is, the height of the side wall that defines the pressure chamber 30, or the height of the pressure chamber 30 at an end) ta' of the pressure chamber-formed substrate 29 at the opening edge of the pressure chamber 30 is thicker than the thickness tb of the substrate in the area outside the opening peripheral area Ae by about 3 μm. In this embodiment, the thickness ta' of the pressure chamber-formed substrate 29 at the opening edge of the pressure chamber 30 is substantially the same as, or slightly thinner (lower) than the distance ta between the lower surface of the diaphragm 31 and the upper surface of the communication substrate 24 in the substantially central portion of the pressure chamber 30. As shown in FIG. 4, the side wall in the lengthwise direction of the pressure chamber 30 is inclined and outwardly widened from the upper surface toward the lower surface. The thickness ta' of the pressure chamber-formed substrate 29 at the opening edge of the pressure chamber 30 is a distance from the opening edge (inside opening edge) of the upper surface to a point where a line from the opening edge of the upper surface vertically down to a virtual surface extending from the lower surface of the pressure chamber-formed substrate 29 is orthogonal to the virtual surface. Consequently, the thickness of the pressure chamber-formed substrate 29 includes the thickness of a part of the pressure chamber-formed substrate 29 containing the space formed by removing the pressure chamber-formed substrate 29.

The upper surface of the pressure chamber-formed substrate 29 at the opening edge of the pressure chamber 30 is inclined downward toward the outside (the outer periphery of the pressure chamber-formed substrate 29). That is, the thickness of the pressure chamber-formed substrate 29 is gradually decreased outward from the opening edge of the pressure chamber 30 where the thickness of the substrate is thickest. The area where the thickness of the pressure chamber-formed substrate 29 is thicker than the other area corresponds to the opening peripheral area Ae. In this embodiment, the thickness of the area other than the opening peripheral area Ae of the pressure chambers 30 is set to a thickness substantially the same as the thickness tb to the end portions (outer periphery) of the pressure chamber-formed substrate 29. In this embodiment, the opening edge of the pressure chamber 30 in the lengthwise direction and the opening edge of the pressure chamber 30 in the widthwise direction have the same thickness tb, however, the thickness of the opening edges may be different.

As described above, the suppression in the deformation in the opening peripheral area Ae due to deformation of the piezoelectric element 32 toward the side opposite to the diaphragm 31 in the initial state can be achieved by the pressure chamber-formed substrate 29 having the thickness in the opening peripheral area Ae of the pressure chamber 30 thicker than the thickness of the pressure chamber-formed substrate 29 in the area outside the opening peripheral area Ae. Consequently, the separation of the pressure chamber-formed substrate 29 and the communication substrate 24 due to the adhesive bonding the pressure chamber-formed substrate 29 and the communication substrate 24 coming off in the opening peripheral area Ae can be suppressed. Accordingly, deterioration in the adhesion between the pressure chamber-formed substrate 29 and the communication substrate 24 due to the ink entering from the portion where the pressure chamber-formed substrate 29 and the communication substrate 24 are separated can be suppressed. Furthermore, clogging of the nozzles 22 and curved discharge of ink droplets due to the adhesive coming off the substrates can be suppressed. Consequently, the reliability of the piezoelectric device can be increased. Furthermore, the separation of the pressure chamber-formed substrate 29 and the communication substrate 24 caused by repetitive drive of the piezoelectric elements 32 can be suppressed. Furthermore, defective bonding of the pressure chamber-formed substrate 29 with the diaphragm 31 or the communication substrate 24 caused by steps formed on the pressure chamber-formed substrate 29 can be suppressed by the pressure chamber-formed substrate 29 that has the thickness gradually increased toward the pressure chamber 30.

Figure 6A:
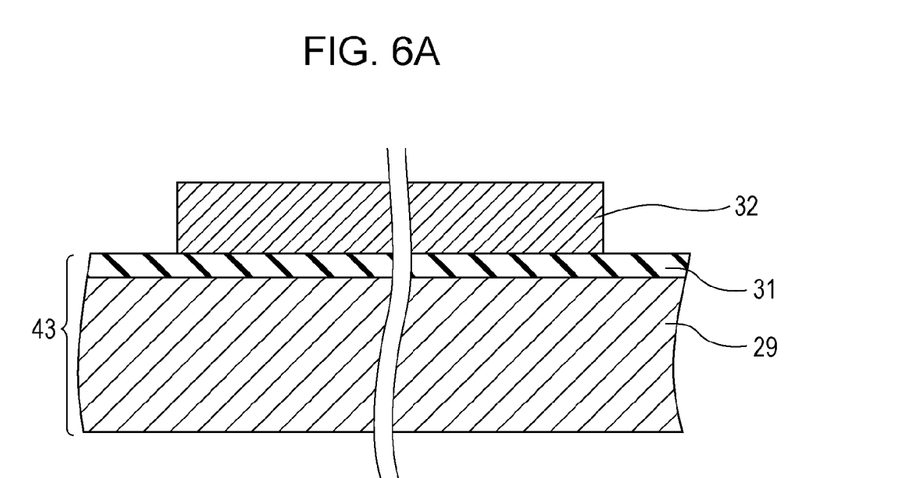
FIGS. 6A and 6B are schematic views of steps of manufacturing the recording head.

Now, a method of manufacturing the portion corresponding to the piezoelectric device in the recording head 3, that is, the portion including the communication substrate 24, the pressure chamber-formed substrate 29, the diaphragm 31, and the piezoelectric element 32 will be described. First, a layer (for example, a film made by providing zirconium oxide (ZrOx) on silicon dioxide ($SiO_2$)) to be the diaphragm 31 is formed on a substrate (for example, a silicon substrate) to be the pressure chamber-formed substrate 29 to form a substrate 43 to be the pressure chamber-formed substrate 29 and the diaphragm 31. After the substrate 43 is formed, the process proceeds to a piezoelectric element forming step. In the piezoelectric element forming step, as shown in FIG. 6A, the piezoelectric element 32 is formed on a surface of the substrate 43 to be the diaphragm 31. Specifically, a metal film that is to be the lower electrode layer 36 is formed on the surface of the substrate 43 to be the diaphragm 31, and patterning of the lower electrode layer 36 is performed by photolithography and etching. Similarly, the piezoelectric layer 37, the upper electrode layer 38, and the metal layer 39 are formed in sequence and thereby the piezoelectric element 32 is formed on the substrate 43 (see FIG. 6A). The piezoelectric element 32 is not easily deformed since the stiffness of the substrate 43 is high against a force to deform the piezoelectric element 32 in the direction opposite to the substrate 43 caused by a tensile force of the layers constituting the piezoelectric element 32.

Figure 6B:
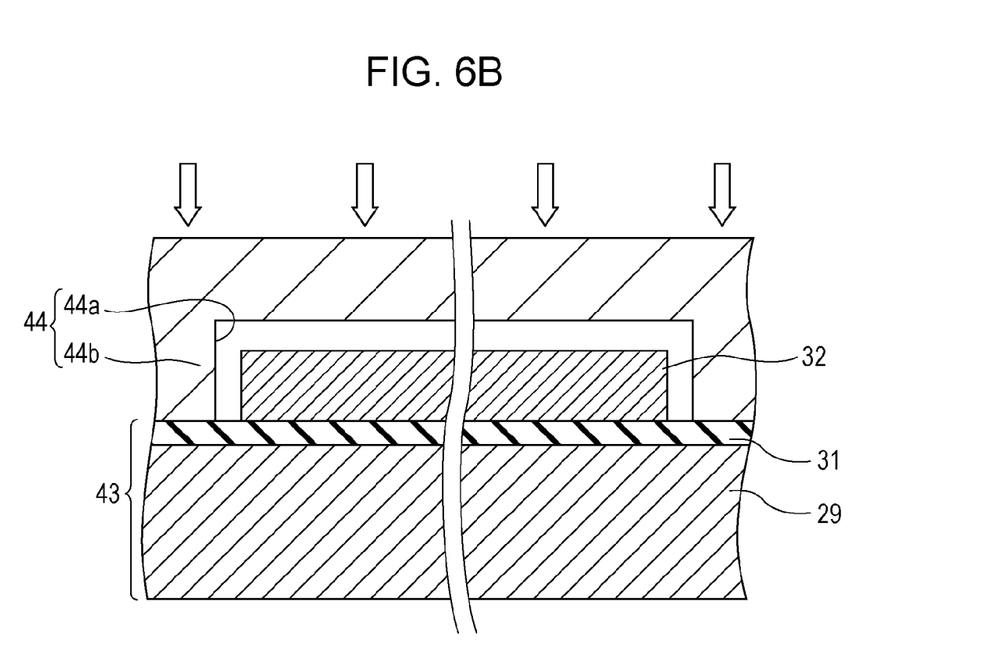
Figure 7A:
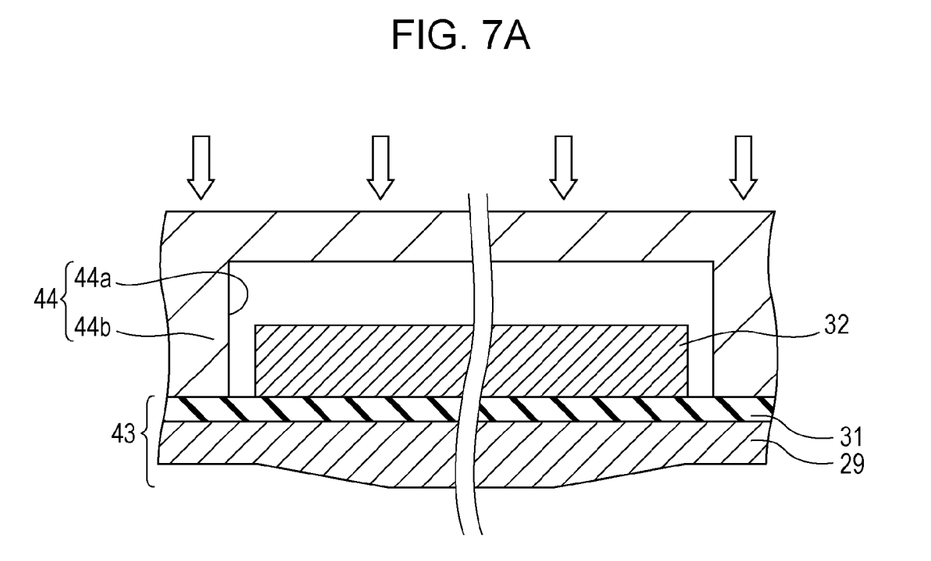
FIGS. 7A and 7B are schematic views of steps of manufacturing the recording head.
Figure 7B:
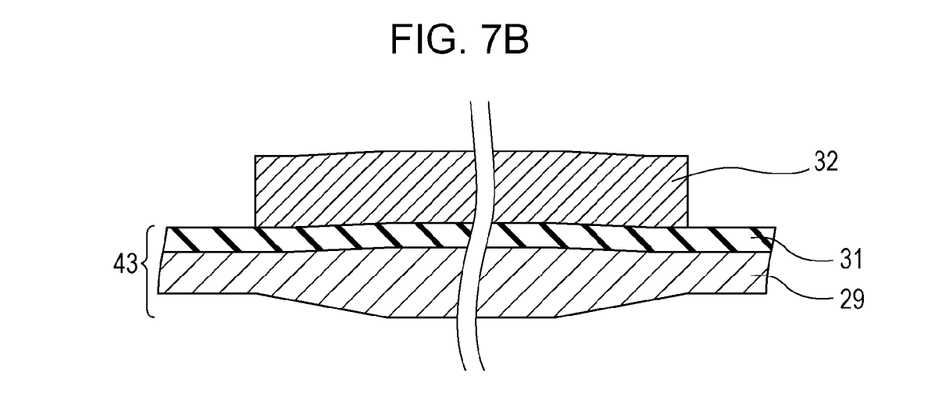

After the piezoelectric element 32 is formed on the substrate 43, the process proceeds to a polishing step. In the polishing step, the substrate to be the pressure chamber-formed substrate 29 is polished to a thickness (for example, about 40 to 50 μm) of the pressure chamber-formed substrate 29. In this step, the substrate 43 is polished (ground) on the side opposite to the piezoelectric element 32 while the area (area outside the opening peripheral area Ae) other than the piezoelectric elements 32 on the substrate 43 is being pressed from the side of the piezoelectric element 32 in the thickness direction such that the thickness of the substrate 43 in the areas (opening peripheral areas Ae) not pressed becomes thicker than the thickness of the substrate 43 in the pressed area. In this embodiment, the substrate 43 is pressed by pushing a pressing substrate 44 onto the surface (surface of the side of the piezoelectric element 32) of the side opposite to the surface of the substrate 43 being polished as shown in FIG. 6B. The pressing substrate 44 has a space 44a that is recessed partway in the thickness direction provided in the area opposite to the area corresponding to the opening peripheral area Ae of the substrate 43, and accommodates the piezoelectric element 32 in the space 44a in the state in which the pressing substrate 44 is pushed against the substrate 43. The outside of the space 44a of the pressing substrate 44 serves as a pressing portion 44b for pressing the area outside the area corresponding to the opening peripheral area Ae of the substrate 43. While the substrate 43 is being pressed by the pressing substrate 44, the substrate 43 is polished from the opposite side, for example, by chemical-mechanical polishing (CMP) as shown in FIG. 7A. In the polishing process, the polishing (grinding) rate in the area corresponding to the part not being pressed is decreased, and the thickness of the substrate in this area becomes thicker than the thickness of the substrate in the area being pressed by the pressing portion 44b. After the polishing process, the pressing substrate 44 is removed, and the substrate 43 that includes the area not pressed, the area protruding toward the opposite side of the piezoelectric element 32 compared with the pressed area, has been formed as shown in FIG. 7B. In other words, the thickness of the substrate 43 gradually increases from the area corresponding to the area other than the piezoelectric element 32 toward the area corresponding to the piezoelectric element 32.

Figure 8A:
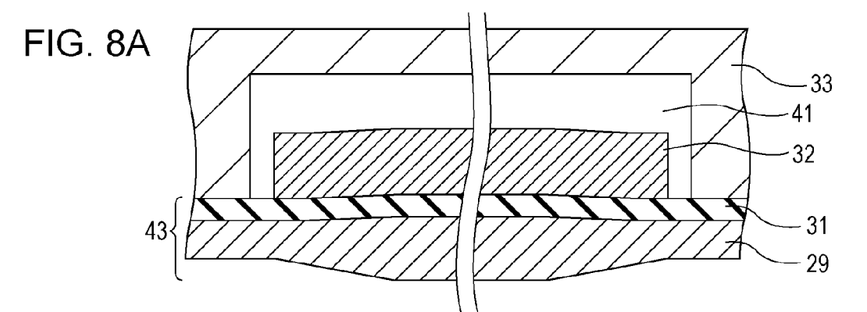
FIGS. 8A to 8C are schematic views of steps of manufacturing the recording head.
Figure 8B:
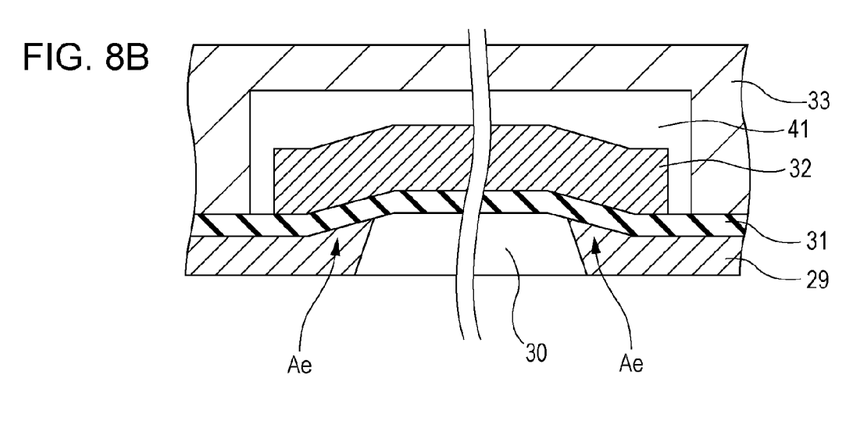

In this state, as shown in FIG. 8A, the sealing plate 33 is attached to the surface of the substrate 43 of the side of the piezoelectric element 32 while the piezoelectric element 32 is being accommodated in the piezoelectric element housing space 41. After the attachment of the sealing plate 33 to the substrate 43, the process proceeds to a pressure chamber forming step (empty chamber forming step according to the invention). In the pressure chamber forming step, the pressure chamber 30 is formed in the area corresponding to the piezoelectric element 32 where the polished substrate 43 is thick. Specifically, on the surface of the substrate 43 opposite to the piezoelectric element 32, patterning of a photoresist is performed by photolithography. Then, the pressure chamber 30 is etched into the substrate to be the pressure chamber-formed substrate 29 in the substrate 43 in the thickness direction. After the photoresist is removed, as shown in FIG. 8B, the pressure chamber 30 has been formed, and the substrate 43 becomes the pressure chamber-formed substrate 29 and the diaphragm 31. That is, while the pressure chamber 30 is formed, the pressure chamber-formed substrate 29 that has the thickness gradually increased toward the pressure chamber 30 is formed. By the formation of the pressure chamber 30, the stiffness of the pressure chamber-formed substrate 29 is decreased. Consequently, the pressure chamber-formed substrate 29 and the diaphragm 31 in the opening peripheral area Ae of the pressure chamber 30 are pulled toward the piezoelectric element 32 due to the force to deform the piezoelectric element 32 toward the side opposite to the pressure chamber-formed substrate 29. That is, the thick part of the pressure chamber-formed substrate 29, the part protruded toward the side opposite to the piezoelectric element 32 in the previous state of the formation of the pressure chamber 30, protrudes toward the piezoelectric element 32. With this structure, the surface (surface to be bonded to the communication substrate 24) opposite to the piezoelectric element 32 in the pressure chamber-formed substrate 29 becomes substantially flat.

Figure 8C:
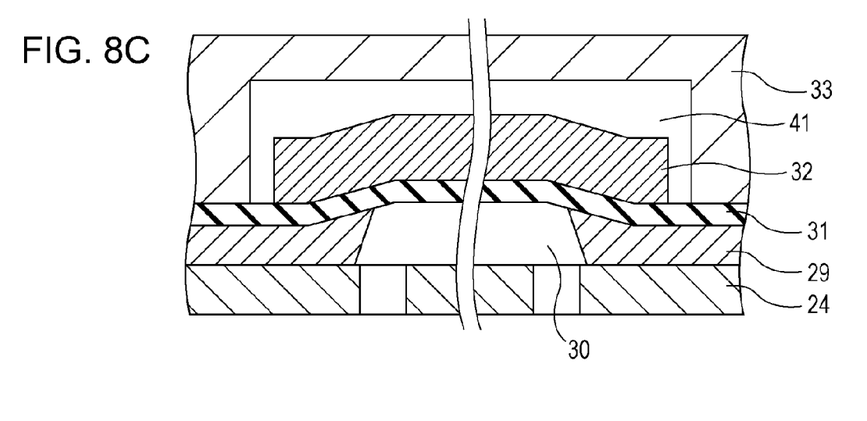

Finally, in a substrate bonding step, as shown in FIG. 8C, the communication substrate 24 is bonded to the side of the pressure chamber-formed substrate 29 opposite to the piezoelectric element 32, and thereby the part corresponding to the piezoelectric device is formed. In this embodiment, in the pressure chamber forming step, the surface of the pressure chamber-formed substrate 29 opposite to the piezoelectric element 32 becomes substantially flat, however, for example, due to the initial shape of the piezoelectric element 32 or the thickness of the pressure chamber-formed substrate 29, the surface of the pressure chamber-formed substrate 29 opposite to the piezoelectric element 32 may not be substantially flat when the pressure chamber 30 is formed. In this case, the surface of the pressure chamber-formed substrate 29 opposite to the piezoelectric element 32 can be made to be substantially flat while the opening peripheral area Ae of the pressure chamber 30 is made to protrude toward the piezoelectric element 32 by bonding the communication substrate 24 by pressing it toward the pressure chamber-formed substrate 29. In this state, the stress to return to the original shape (that is, the state protruding toward the communication substrate 24) remains in the opening peripheral area Ae. Accordingly, even if the piezoelectric element 32 is deformed toward the side opposite to the diaphragm, the opening peripheral area Ae is not easily deformed. Consequently, the separation of the pressure chamber-formed substrate 29 and the communication substrate 24 can be further suppressed.

In the above-described first embodiment, in the pressure chamber-formed substrate 29, the thickness in the entire opening peripheral area Ae of the pressure chamber 30, that is, the entire perimeter of the opening peripheral edge of the pressure chamber 30, is thicker than the area outside the opening peripheral area Ae, however, the structure is not limited to this example. Alternatively, at least a part of the pressure chamber-formed substrate in the opening peripheral area of the pressure chamber may have a thickness thicker than the thickness in the area outside the opening peripheral area. Furthermore, the thickness of the pressure chamber-formed substrate 29 in the first embodiment gradually increases toward the pressure chamber 30 in the entire opening peripheral area Ae of the pressure chamber 30, however, the structure is not limited to this example. Alternatively, the thickness of the pressure chamber-formed substrate in at least a part of the opening peripheral area of the pressure chamber may be gradually increased toward the pressure chamber. Furthermore, in the pressure chamber-formed substrate 29 in the first embodiment, the thickness in the area other than the opening peripheral area Ae of the pressure chamber 30 is substantially the same, however, the structure is not limited to this example. For example, the thickness of a part of the pressure chamber-formed substrate in the area other than the opening peripheral area of the pressure chamber may be thicker. That is, the thickness of the pressure chamber-formed substrate in the opening peripheral area of the pressure chamber is thicker than the thickness in at least a part of the area outside the opening peripheral area.

Figure 9:
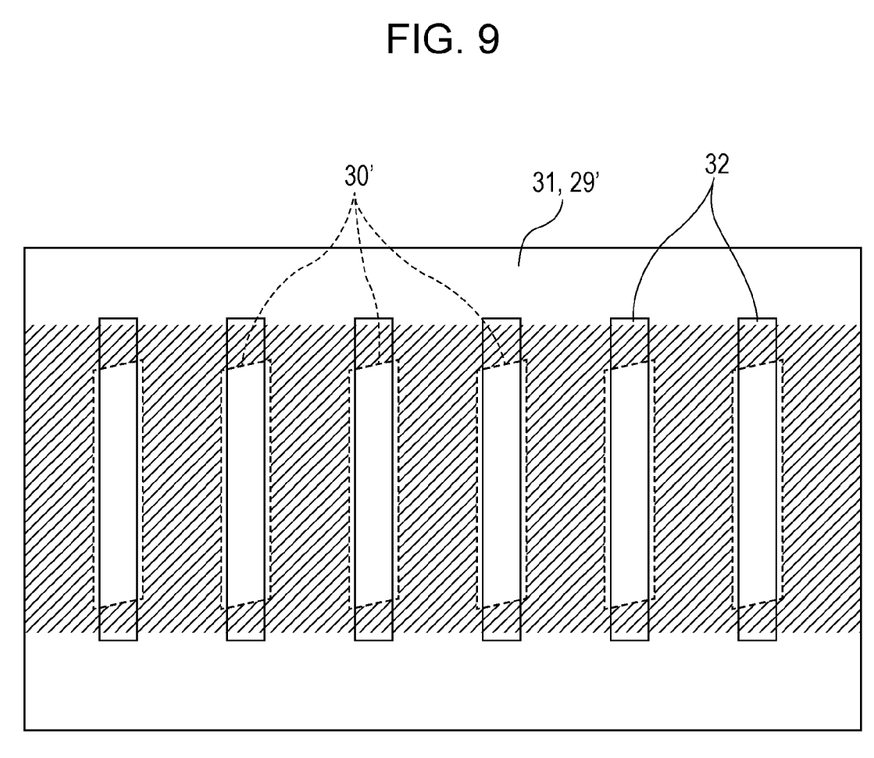
FIG. 9 is a plan view of a pressure chamber-formed substrate of a recording head according to a second embodiment.

For example, in a pressure chamber-formed substrate 29' (piezoelectric device) in the second embodiment shown in FIG. 9, the thickness in opening peripheral areas of pressure chambers 30' and the thickness in areas between the pressure chambers 30' are thicker. In FIG. 9, the thicker areas in the substrate are hatched. Specifically, in the pressure chamber-formed substrate 29' in the second embodiment, the thickness of the substrate is gradually increased from outside the end portions in the lengthwise direction of the pressure chambers 30' toward the array of the pressure chambers 30'. That is, the thickness in the band-shaped area wider than the width of the pressure chambers 30' in the lengthwise direction and extended in the array direction of the piezoelectric elements 32 (except for the pressure chambers 30') is thicker than the thickness in the areas outside the band-shaped area. The band-shaped area includes the opening peripheral areas of the pressure chambers 30'. In this embodiment, the thickness of the pressure chamber-formed substrate 29' is made to be substantially the same along the nozzle array direction (that is, the array direction of the pressure chambers 30'). If the array pitch of the pressure chambers 30' is a narrow pitch (for example, 600 dpi) as in this embodiment, the areas between adjacent pressure chambers 30' can be considered to be the opening peripheral areas of the individual pressure chambers 30'. In other words, the above-described band-shaped area may be considered as a continuous line of the opening peripheral areas of the pressure chambers 30'. The other structures are similar to those in the first embodiment, and accordingly, their descriptions are omitted.

Figure 10A:
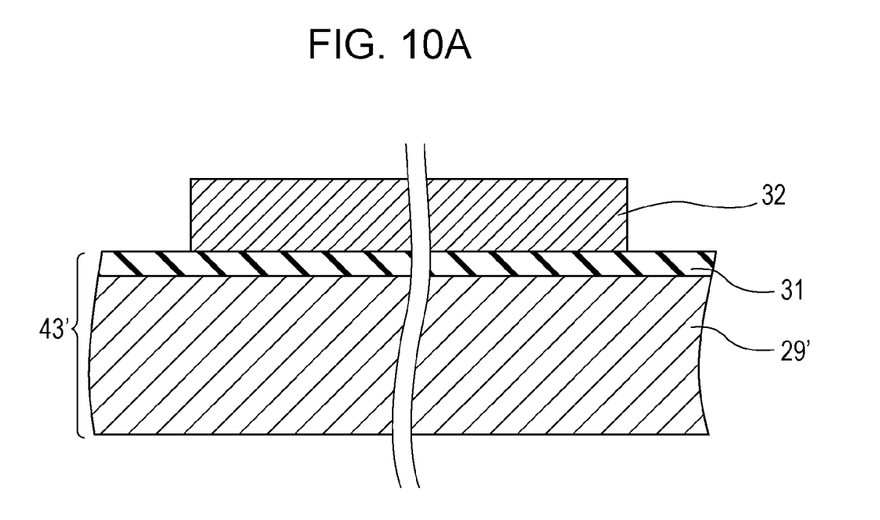
FIGS. 10A and 10B are schematic views of steps of manufacturing the recording head according to the second embodiment.
Figure 10B:
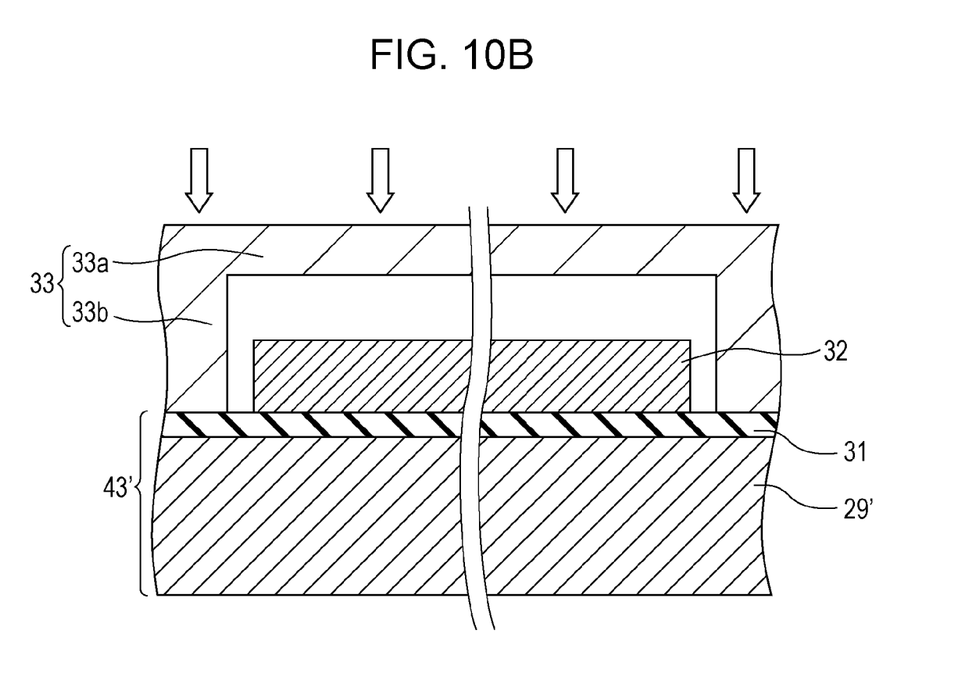

Now, a method of manufacturing the piezoelectric device according to the second embodiment will be described. The piezoelectric device according to the second embodiment can be made by the same manufacturing method according to the first embodiment, however, a simpler manufacturing method will be described. First, similarly to the manufacturing method according to the first embodiment, a layer to be the diaphragm 31 is formed on a substrate (for example, a silicon substrate) to be the pressure chamber-formed substrate 29' to form a substrate 43' to be the pressure chamber-formed substrate 29' and the diaphragm 31. After the substrate 43' is formed, similarly to the manufacturing method according to the first embodiment, in a piezoelectric element forming step, the piezoelectric element 32 is formed on the surface of the substrate 43' to be the diaphragm 31 (see FIG. 10A). After the piezoelectric element 32 is formed on the substrate 43', as shown in FIG. 10B, the sealing plate 33 is attached to the surface of the substrate 43' of the piezoelectric element 32 side. In this manufacturing method according to the embodiment, the process proceeds to a polishing step in this state.

Figure 11A:
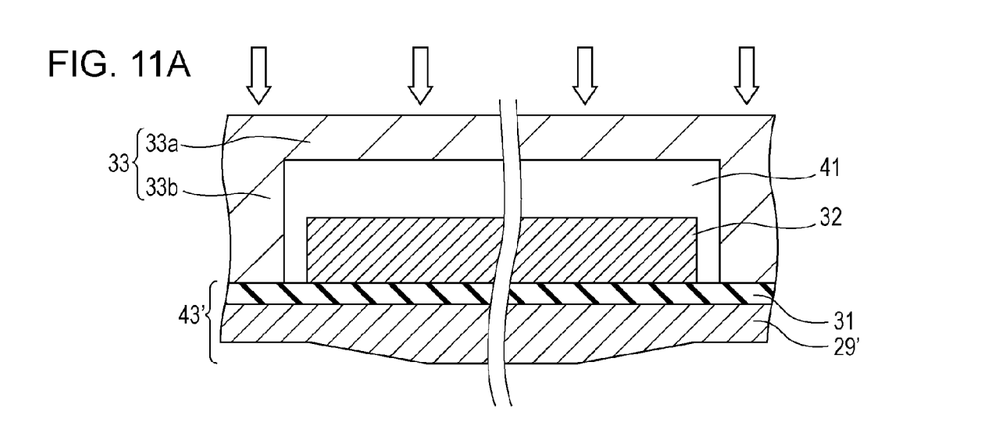
FIGS. 11A to 11C are schematic views of steps of manufacturing the recording head according to the second embodiment.

In the polishing step, the substrate to be the pressure chamber-formed substrate 29' is polished while the sealing plate 33 is being pressed from the ceiling portion 33a side. The side wall portion 33b of the sealing plate 33 comes in contact with the areas in the array direction (nozzle array direction) of the piezoelectric elements 32 in areas outside the end portions of the piezoelectric elements 32 of the substrate 43' in the lengthwise direction and thereby the areas are pressed. While the sealing plate 33 is being pressed from the piezoelectric element 32 side, similarly to the manufacturing method according to the first embodiment, the substrate 43' is polished (ground) on the side opposite to the piezoelectric element 32 such that the thickness of the substrate 43' in the areas not pressed becomes thicker than the thickness of the substrate 43' in the pressed areas. By the process, as shown in FIG. 11A, the substrate 43' that includes the areas not pressed (the areas corresponding to the piezoelectric element housing spaces 41), the areas protruding toward the opposite side of the piezoelectric element 32 compared with the pressed areas is formed. In other words, the thickness of the substrate 43' is gradually increased from the areas corresponding to the areas other than the array of the piezoelectric elements 32 toward the area corresponding to the piezoelectric elements 32.

Figure 11B:
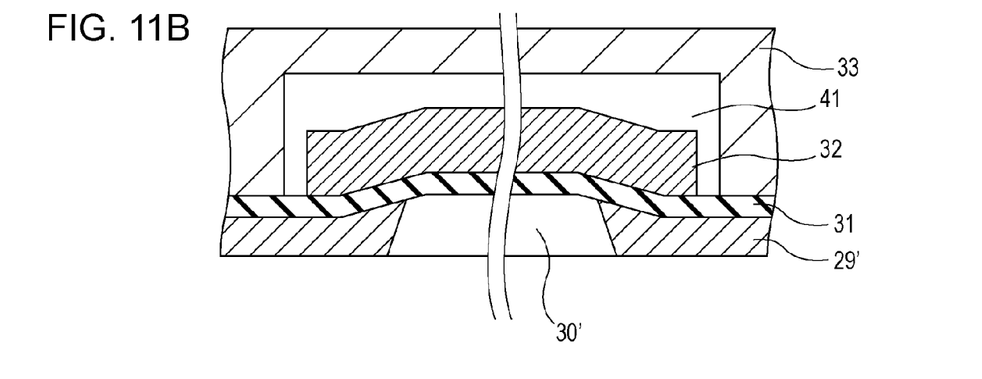
Figure 11C:
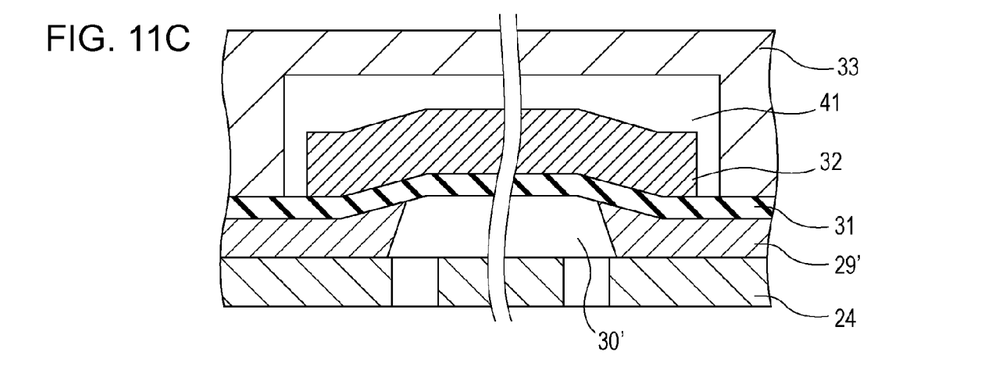

After the substrate 43' is polished, similarly to the manufacturing method according to the first embodiment, in a pressure chamber forming step, a piezoelectric element 30' is formed in the area corresponding to the piezoelectric element 32 where the polished substrate 43' is thicker. By this process, as shown in FIG. 11B, the pressure chamber 30' is formed, and the substrate 43' becomes the pressure chamber-formed substrate 29' and the diaphragm 31. That is, while the pressure chamber 30' is formed, the pressure chamber-formed substrate 29' that has the thickness gradually increased from the outside of the array of the pressure chambers 30' toward the array of the pressure chambers 30' is formed. Also in this embodiment, by the formation of the pressure chambers 30', the stiffness of the pressure chamber-formed substrate 29' is decreased. Accordingly, the pressure chamber-formed substrate 29' and the diaphragm 31 in the outside of the array of the pressure chambers 30' are pulled toward the piezoelectric elements 32 due to the force to deform the piezoelectric elements 32 toward the side opposite to the pressure chamber-formed substrate 29'. That is, the thicker parts of the pressure chamber-formed substrate 29', the parts protruded toward the side opposite to the piezoelectric element 32 in the previous state of the formation of the pressure chamber 30, protrude toward the piezoelectric elements 32. Consequently, also in this embodiment, the surfaces of the pressure chamber-formed substrate 29' opposite to the piezoelectric elements 32 become substantially flat. Finally, in a substrate bonding step, as shown in FIG. 11C, the communication substrate 24 is bonded to the side of the pressure chamber-formed substrate 29' opposite to the piezoelectric elements 32, and thereby the part corresponding to the piezoelectric device is formed.

As described above, according to the manufacturing method according to the embodiment, the substrate 43' is pressed by using the sealing plate 33, and unlike the manufacturing method according to the first embodiment, it is not necessary to separately press the substrate 43' by using the pressing substrate 44, and thereby this manufacturing step can be omitted. By the manufacturing method, the high-reliability piezoelectric device with suppressed separation of the pressure chamber-formed substrate 29' and the communication substrate 24 can be more readily manufactured.

In the above-described embodiments, in the plan views, the pressure chambers 30 and 30' are substantially parallelograms, however, the shapes are not limited to these shapes. The pressure chambers 30 and 30' may be various shapes, for example, rectangular shapes, trapezoidal shapes, circular shapes, or elliptical shapes in the plan views. That is, at least a part of the pressure chamber-formed substrate in the opening peripheral area of the pressure chamber has a thickness thicker than the thickness in the area outside the opening peripheral area irrespective of the shapes of the pressure chambers. Alternatively, the thickness of the pressure chamber-formed substrate in at least a part of the opening peripheral area of the pressure chamber may be gradually increased toward the pressure chamber.

In the above-described embodiments, the example piezoelectric device that includes the communication substrate 24, the pressure chamber-formed substrate 29, the diaphragm 31, and the piezoelectric elements 32 in the recording head 3 has been described. The piezoelectric device may be other piezoelectric devices that include a first substrate having an empty chamber, a piezoelectric element provided above the empty chamber via a diaphragm, and a second substrate provided to the side opposite to the piezoelectric element on the first substrate. The liquid ejection head may be, for example, a color material discharging head to be used for manufacturing color filters such as liquid crystal displays, an electrode material discharging head to be used for forming electrodes for organic ELs and FEDs, or a bio-organic substance discharging head to be used for manufacturing biochips (biochemical elements).

The entire disclosure of Japanese Patent Application No: 2015-133268, filed Jul. 2, 2015 is expressly incorporated by reference herein in its entirety.

What is claimed is:

1. A piezoelectric device comprising:
   a first substrate having an empty chamber;
   a diaphragm defining a surface of the empty chamber;
   a piezoelectric element formed by stacking a first electrode layer, a piezoelectric layer, and a second electrode layer in sequence from the diaphragm side, the piezoelectric element provided on the side of the diaphragm opposite to the empty chamber; and
   a second substrate provided on the side of the first substrate opposite to the diaphragm,
   wherein the thickness of at least a part of the first substrate in an opening peripheral area of the empty chamber is thicker than the thickness in an area outside the opening peripheral area,
   the thickness in the opening peripheral area causing a portion of the diaphragm in the opening peripheral area to be raised upward in a state where no voltage is applied to the piezoelectric element.

2. The piezoelectric device according to claim 1, wherein the thickness in the entire periphery of the opening peripheral area is thicker than the thickness in the area outside the opening peripheral area.

3. A liquid ejection head comprising:
   the piezoelectric device according to claim 2; and
   a nozzle communicating with the empty chamber.

4. A liquid ejection head comprising:
   the piezoelectric device according to claim 1; and
   a nozzle communicating with the empty chamber.

5. A piezoelectric device comprising:
   a first substrate having an empty chamber;
   a diaphragm defining a surface of the empty chamber;

a piezoelectric element formed by stacking a first electrode layer, a piezoelectric layer, and a second electrode layer in sequence from the diaphragm side, the piezoelectric element provided on the side of the diaphragm opposite to the empty chamber; and
a second substrate provided on the side of the first substrate opposite to the diaphragm,
wherein the thickness of at least a part of the first substrate is gradually increased toward the empty chamber causing a portion of the diaphragm to be raised upward in a state where no voltage is applied to the piezoelectric element.

6. A liquid ejection head comprising:
the piezoelectric device according to claim 5; and
a nozzle communicating with the empty chamber.

* * * * *